(12) United States Patent
Kang et al.

(10) Patent No.: US 12,438,116 B2
(45) Date of Patent: Oct. 7, 2025

(54) BONDING APPARATUS AND METHOD OF CONTROLLING THE SAME

(71) Applicant: HANWHA PRECISION MACHINERY CO., LTD., Changwon-si (KR)

(72) Inventors: Tae Woo Kang, Changwon-si (KR); Ji Hwan Bae, Changwon-si (KR); Yong Hyun Lee, Changwon-si (KR)

(73) Assignee: HANWHA PRECISION MACHINERY CO., LTD., Changwon-si (KR)

( * ) Notice: Subject to any disclaimer, the term of this patent is extended or adjusted under 35 U.S.C. 154(b) by 552 days.

(21) Appl. No.: 17/888,771

(22) Filed: Aug. 16, 2022

(65) Prior Publication Data

US 2023/0089276 A1 Mar. 23, 2023

(30) Foreign Application Priority Data

Sep. 23, 2021 (KR) .......................... 10-2021-0125867

(51) Int. Cl.
*H01L 21/338* (2006.01)
*H01L 23/00* (2006.01)

(52) U.S. Cl.
CPC .............. *H01L 24/74* (2013.01); *H01L 24/80* (2013.01); *H01L 24/05* (2013.01); *H01L 24/08* (2013.01);
(Continued)

(58) Field of Classification Search
CPC ......... H01L 24/74; H01L 24/80; H01L 24/05; H01L 24/08; H01L 2224/05647; H01L 2224/05687; H01L 2224/08225; H01L 2224/80203; H01L 2224/80895; H01L 2224/80896; H01L 2224/80908; H01L 24/75; H01L 21/6836; H01L 24/81; H01L 21/67712; H01L 21/67721; H01L 2224/73204; H01L 24/73; H01L 2224/75745; H01L 2224/0401; H01L 2224/83203; H01L 2224/75702; H01L 2224/75251; H01L 2224/75252; H01L 2224/85205; H01L 2224/32013; H01L 2224/78744; H01L 21/76251; H01L 2224/75263; H01L 2224/75266; H01L 2224/85009; H01L 2224/75841;
(Continued)

(56) References Cited

FOREIGN PATENT DOCUMENTS

| JP | 2006-310442 A | 11/2006 |
|---|---|---|
| JP | 2008-147705 A | 6/2008 |

(Continued)

OTHER PUBLICATIONS

Seo et al., "Cu—SiO2 Hybrid Bonding", J. Microelectron. Packag. Soc., 27(1), 17-24 (2020), Print ISSN 1226-9360, Online ISSN 2287-7525, The Korean Microelectronics and Packaging Society, 2020, (8 pages total).

(Continued)

*Primary Examiner* — Niki H Nguyen
(74) *Attorney, Agent, or Firm* — Sughrue Mion, PLLC (57) ABSTRACT

Provided are a bonding apparatus and a method of controlling the bonding apparatus. The bonding apparatus includes a bonding head, a wafer chuck configured to receive a wafer thereon, and at least one bonding stage cover disposed above the wafer chuck.

17 Claims, 6 Drawing Sheets

(52) U.S. Cl.
CPC ............... *H01L 2224/05647* (2013.01); *H01L 2224/05687* (2013.01); *H01L 2224/08225* (2013.01); *H01L 2224/80203* (2013.01); *H01L 2224/80895* (2013.01); *H01L 2224/80896* (2013.01); *H01L 2224/80908* (2013.01)

(58) Field of Classification Search
CPC . H01L 2224/83907; H01L 2224/04026; H01L 2224/75744
See application file for complete search history.

(56) References Cited

FOREIGN PATENT DOCUMENTS

| | | | |
|---|---|---|---|
| KR | 10-2005-0073753 A | 7/2005 | |
| KR | 10-1430819 B1 | 8/2014 | |
| TW | I619181 B * | 3/2018 | ............. H01L 24/81 |

OTHER PUBLICATIONS

Office Action dated Jul. 14, 2023, issued by Korean Patent Office in Korean Patent Application No. 10-2021-0125867.

* cited by examiner

BONDING APPARATUS AND METHOD OF CONTROLLING THE SAME

CROSS-REFERENCE TO RELATED APPLICATION

This application claims priority to Korean Patent Application No. 10-2021-0125867, filed on Sep. 23, 2021, in the Korean Intellectual Property Office, the disclosure of which is incorporated by reference herein in its entirety.

BACKGROUND

1. Field

One or more embodiments relate to a bonding apparatus and a method of controlling the bonding apparatus, and more particularly, to a bonding apparatus configured to remove foreign substances and a method of controlling the bonding apparatus.

2. Description of Related Art

In general, a bonding apparatus refers to an apparatus for separating chips from a wafer and mounting the chips on a circuit board (or lead frame). Such bonding apparatuses may be implemented using various bonding methods.

Flip-chip bonding is a bonding method for individually separating semiconductor chips from a wafer substrate, flipping the semiconductor chips, applying flux to bumps, and then pressing the semiconductor chips onto a board. In this case, the board may often be a printed circuit board (PCB) or may be a wafer or a transfer carrier in some processes. After bonding the semiconductor chips to the board, the board is transferred to a reflow oven (for example, a mass reflow oven) to electrically connect the semiconductor chips to the board at a high temperature.

In addition, thermal-compression bonding is a bonding method for individually separating semiconductor chips from a wafer substrate, flipping the semiconductor chips, applying flux to bumps, and then pressing the semiconductor chips onto a board. The board may often be a printed circuit board (PCB) or may be a wafer or a transfer carrier in some processes. When the semiconductor chips are pressed onto the board, high compression force and heat are applied to electrically connect the semiconductor chips to the board. Therefore, a separate reflow oven is not used.

Copper-silicon dioxide (Cu—SiO2) hybrid bonding (low-temperature Cu—SiO2 bonding) is the most recent method in which semiconductor chips are individually separated from a wafer substrate, flipped, and pressed onto a board. In this case, a wafer or a transfer carrier is used as the board, and even at low temperature and with weak compression force, primary bonding is achieved owing to van der Waals force between SiO2 layers on the surfaces of the semiconductor chips. The insides of through-silicon vias (TSVs) are filled with copper by electrolytic plating, and when heat is applied to the TSVs at high temperature during an annealing process in a separate apparatus after the semiconductor chips are stacked, the copper filled in the TSVs (via holes) undergoes thermal expansion, thereby achieving Cu—Cu bonding as secondary bonding. When the semiconductor chips are stacked, bonding occurs at low temperature and pressure, and thus demerits of thermal-compression bonding such as low productivity and limits to bonding position accuracy may be overcome.

In an apparatus for mounting semiconductor chips on a wafer substrate by the Cu—SiO2 hybrid bonding method, however, foreign substances may be formed inside a bonding apparatus, and thus it is needed to remove the foreign substances from the inside of the bonding apparatus.

SUMMARY

One or more embodiments include a bonding apparatus configured to remove foreign substances from the inside thereof, and a method of controlling the bonding apparatus.

However, these embodiments are merely examples, and embodiments of the present disclosure are not limited thereto.

Additional aspects will be set forth in part in the description which follows and, in part, will be apparent from the description, or may be learned by practice of the presented embodiments of the disclosure.

According to an aspect of an embodiment, there is provided a bonding apparatus including a bonding head, a wafer chuck configured to receive a wafer thereon, and at least one bonding stage cover on the wafer chuck.

The at least one bonding stage cover may include a plurality of bonding stage covers, and the plurality of bonding stage covers may include a fixed bonding stage cover and a movable bonding stage cover.

An opening may be formed in the at least one bonding stage cover, and the opening may not overlap with a position to which the bonding head is movable.

The bonding apparatus may further include an air curtain on the at least one bonding stage cover and configured to generate air flow.

The air curtain may include a first air curtain and a second air curtain, and the first air curtain and the second air curtain may be adjacent to each other along a first direction and configured to generate air flows in opposite directions.

A fan filter unit (FFU) may be on the air curtain, and the FFU may introduce air toward the air curtain.

The bonding apparatus may further include an air curtain processor configured to control the air curtain, wherein the air curtain processor performs on/off control on the air curtain.

The bonding apparatus may further include a particle measurer configured to detect foreign substances.

The bonding head may be sealed, and a bonding-head vacuum suction device may be inside the bonding head and configured to remove foreign substances from an inner region of the bonding head.

The bonding apparatus may further include a bonding-head transferer configured to transfer the bonding head, wherein the bonding-head transferer is sealed, and a bonding-head-transfer-unit vacuum suction device is inside the bonding-head transferer and configured to remove foreign substances from an inner region of the bonding-head transferer.

The bonding apparatus may further include a dual vision camera unit configured to take images of an inner region of the bonding apparatus, wherein the dual vision camera is sealed, and a dual vision camera vacuum suction device is inside the dual vision camera and configured to remove foreign substances from an inner region of the dual vision camera.

According to another aspect of an embodiment, there is provided a method of controlling a bonding apparatus, the method including detecting, by a particle measurer, information on foreign substances inside the bonding apparatus, and determining, based on the information on the foreign substances, performance of a bonding process.

The determining performance of the bonding process may include when it is determined, based on the information on the foreign substances, that a foreign substance level is greater than a preset level, moving a bonding head and a dual vision camera to preset avoidance positions, circulating air inside the bonding apparatus by operating a fan filter unit (FFU), and based on the foreign substance level being lowered based on the circulating of air, performing the bonding process.

The determining performance of the bonding process may include when it is determined, based on the information on the foreign substances, that a foreign substrate level is less than a preset level, performing the bonding process.

According to another aspect of an embodiment, there is provided a bonding apparatus including a bonding head, a wafer chuck configured to receive a wafer thereon, at least one bonding stage cover on the wafer chuck, and an air curtain on the at least one bonding stage cover and configured to generate air flow.

The at least one bonding stage cover may include a plurality of bonding stage covers, and the plurality of bonding stage covers may include a fixed bonding stage cover and a movable bonding stage cover.

An opening may be formed in the at least one bonding stage cover.

The air curtain may include a first air curtain and a second air curtain, and the first air curtain and the second air curtain may be adjacent to each other along a first direction and configured to generate air flows in opposite directions.

A fan filter unit (FFU) may be on the air curtain, and the FFU may introduce air toward the air curtain.

The bonding apparatus may further include an air curtain processor configured to control the air curtain, wherein the air curtain processor performs on/off control on the air curtain.

BRIEF DESCRIPTION OF DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. Embodiments described herein are example embodiments, and thus, the disclosure is not limited thereto. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

The present disclosure may have various different forms and various embodiments, and specific embodiments are described with reference to the accompanying drawings. However, the present disclosure is not limited to the specific embodiments, and it should be understood that the idea and technical scope of the embodiments cover all the modifications, equivalents, and replacements. In the descriptions of embodiments, like reference numerals denote like elements.

Hereinafter, embodiments will be described with reference to the accompanying drawings. In the drawings, like reference numerals denote like elements, and overlapping descriptions thereof will be omitted.

In the following descriptions of the embodiments, although terms such as "first" and "second" are used to describe various elements, these elements should not be limited by these terms. These terms are only used to distinguish one element from another element.

The terms of a singular form may include plural forms unless otherwise mentioned.

It will be further understood that the terms "comprises" and/or "comprising" used herein specify the presence of stated features or elements, but do not preclude the presence or addition of one or more other features or elements.

Sizes of elements in the drawings may be exaggerated for ease of explanation. In other words, sizes and thicknesses of elements in the drawings are arbitrarily illustrated for ease of explanation, and thus the following embodiments are not limited thereto.

When a certain embodiment is implemented differently, a specific process order may be performed differently from the described order. For example, two consecutively described processes may be performed substantially at the same time or performed in an order opposite to the described order.

In the following description, the technical terms are used only for explaining a specific embodiment while not limiting the present disclosure. The term "include" or "comprise" used herein specifies the presence of a property, a fixed number, a step, a process, an element, a component, and a combination thereof, but does not exclude the presence or addition of other properties, fixed numbers, steps, processes, elements, components, and combinations thereof.

Hereinafter, a bonding apparatus will be described according to embodiments with reference to FIGS. 1 to 5.

Figure 1:
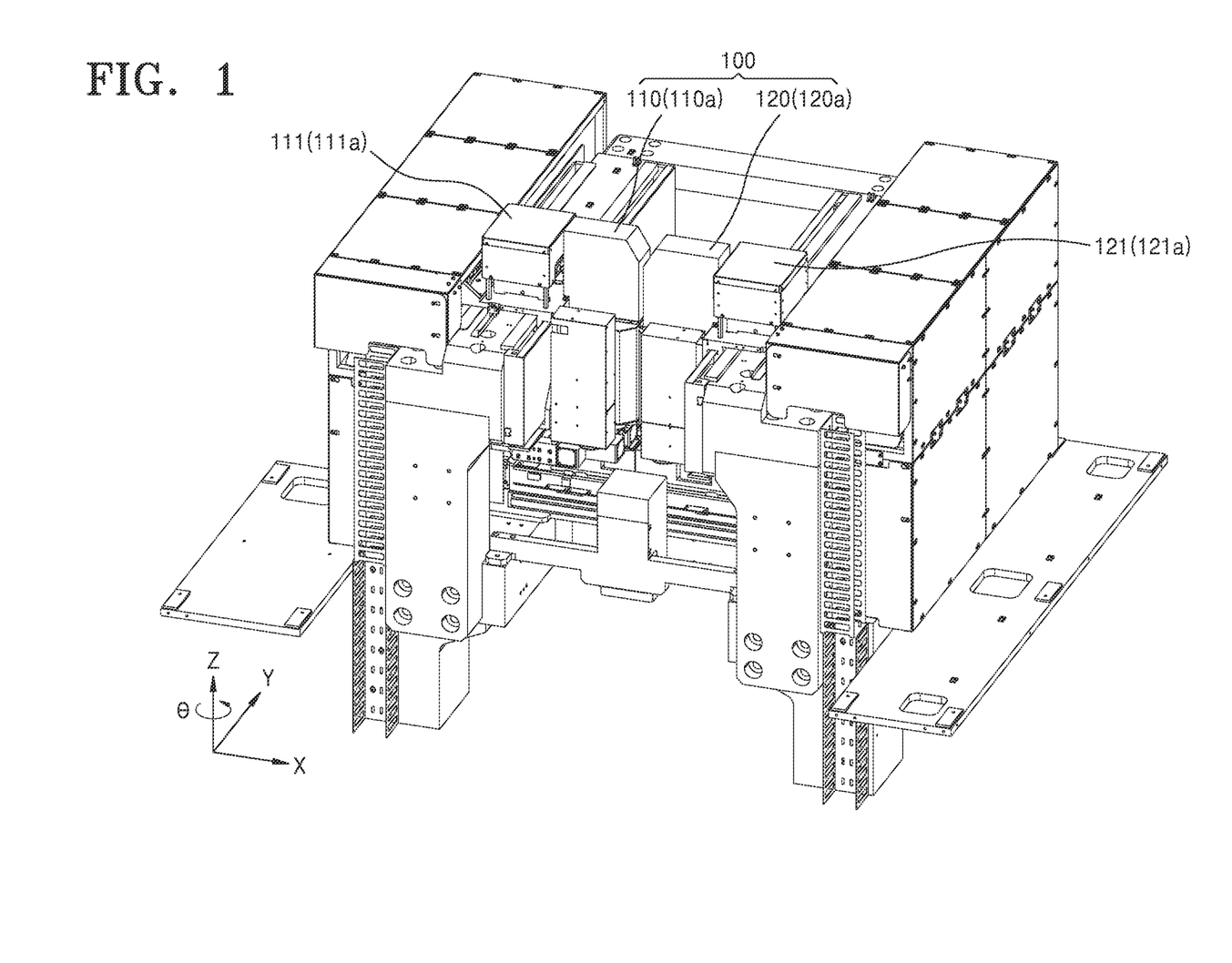
FIG. 1 is a perspective view illustrating a bonding apparatus according to an embodiment.
Figure 2:
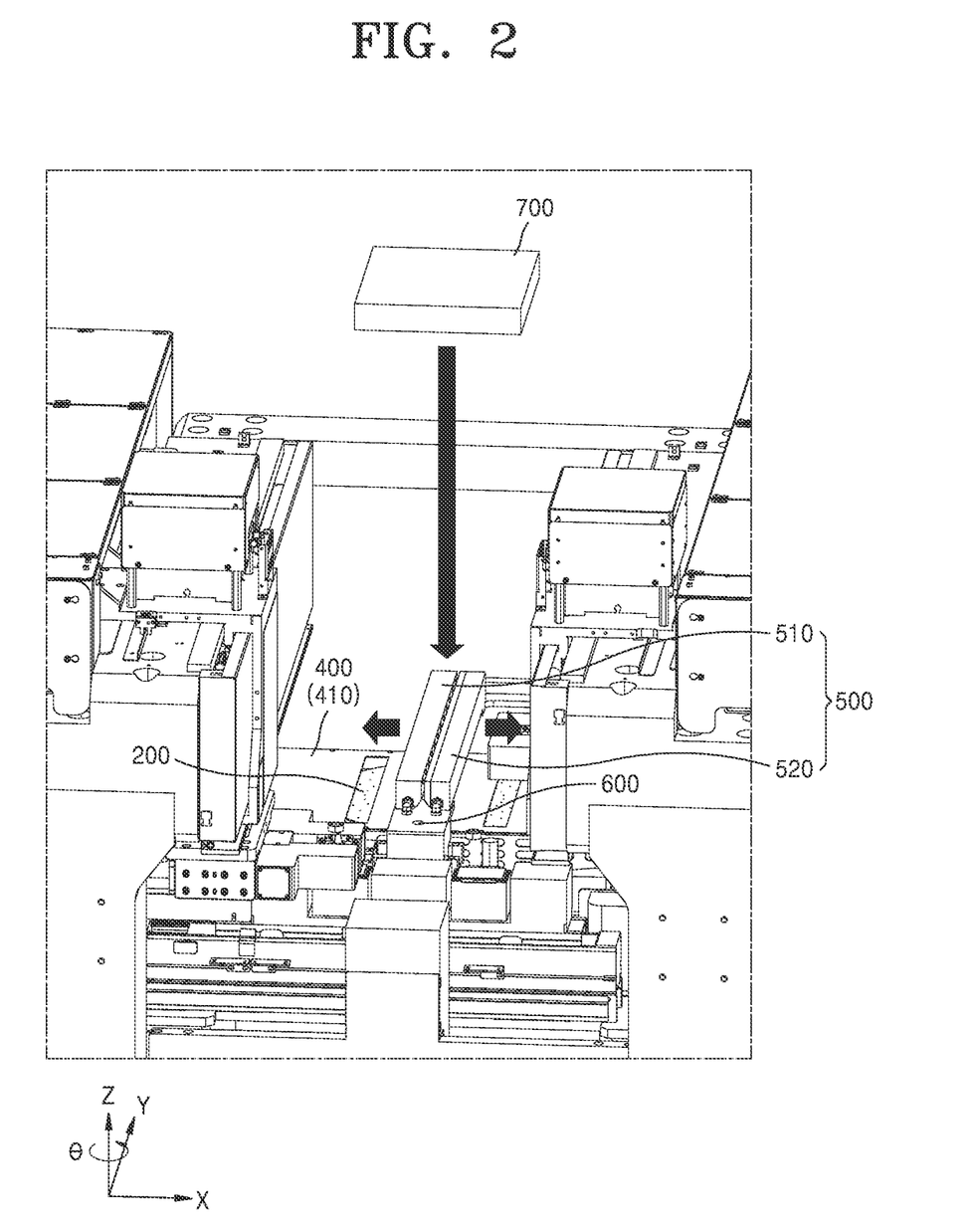
FIG. 2 is a view illustrating a state in which a bonding head is removed from the structure shown in FIG. 1 and air flows through a fan filter unit and an air curtain inside the bonding apparatus according to an embodiment.
Figure 3:
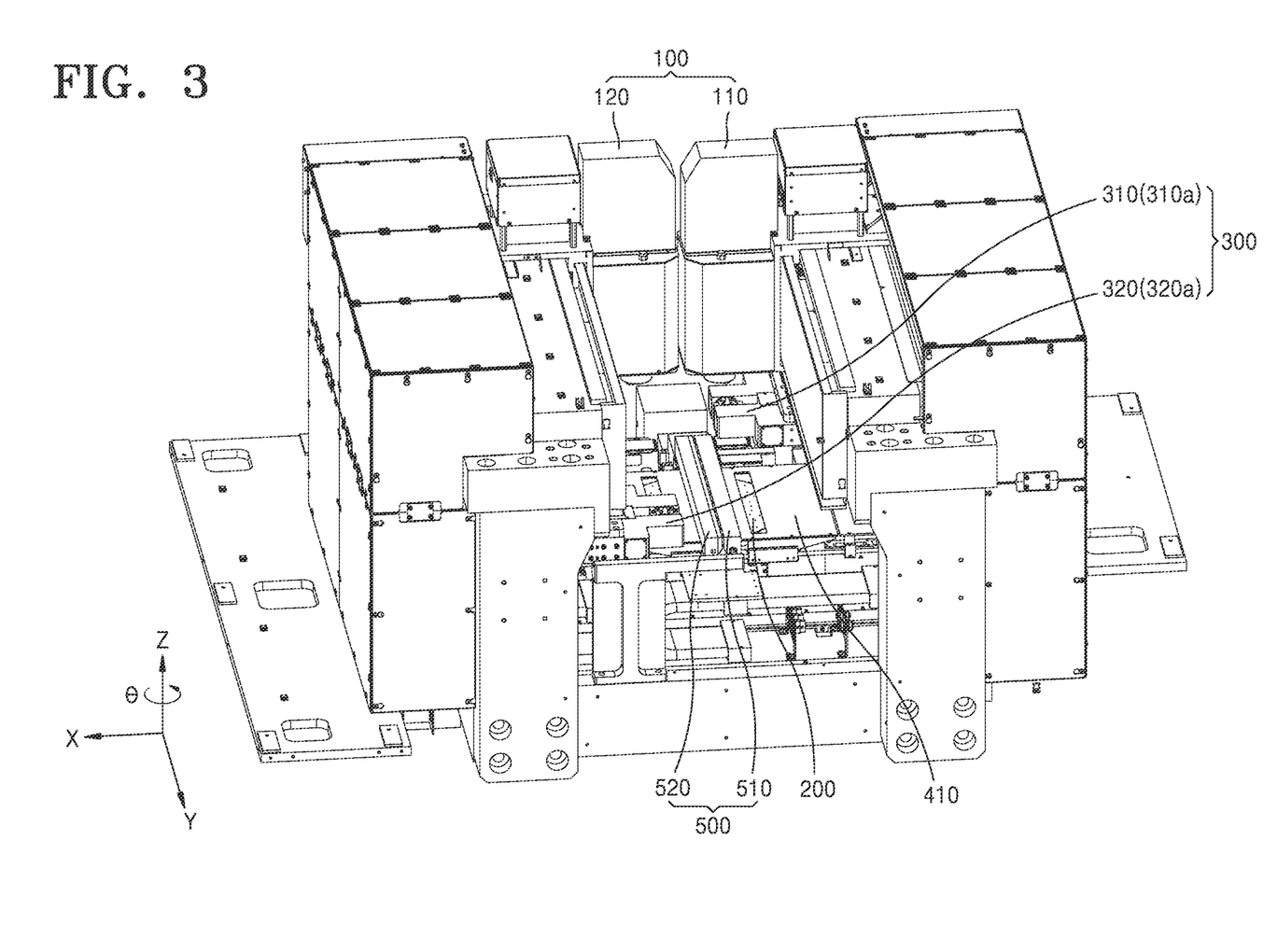
FIG. 3 is a view illustrating the opposite side of the bonding apparatus shown in FIG. 1 according to an embodiment.
Figure 4:
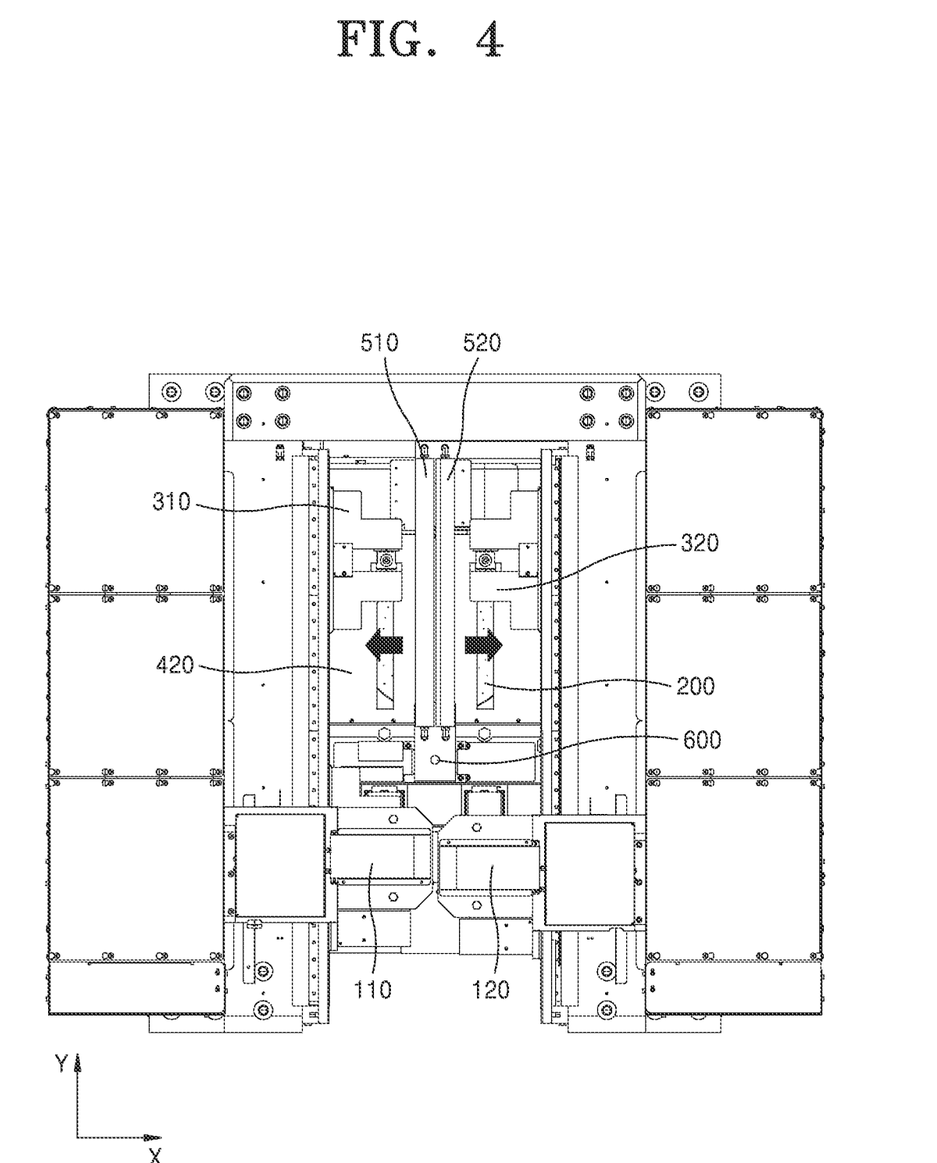
FIG. 4 is a plan view illustrating the bonding apparatus according to an embodiment.

FIG. 1 is a perspective view illustrating a bonding apparatus according to an embodiment. FIG. 2 is a view illustrating a state in which a bonding head is removed from the structure shown in FIG. 1 and air flows through a fan filter unit and an air curtain inside the bonding apparatus according to an embodiment. FIG. 3 is a view illustrating the opposite side of the bonding apparatus shown in FIG. 1 according to an embodiment. FIG. 4 is a plan view illustrating the bonding apparatus according to an embodiment.

Figure 5:
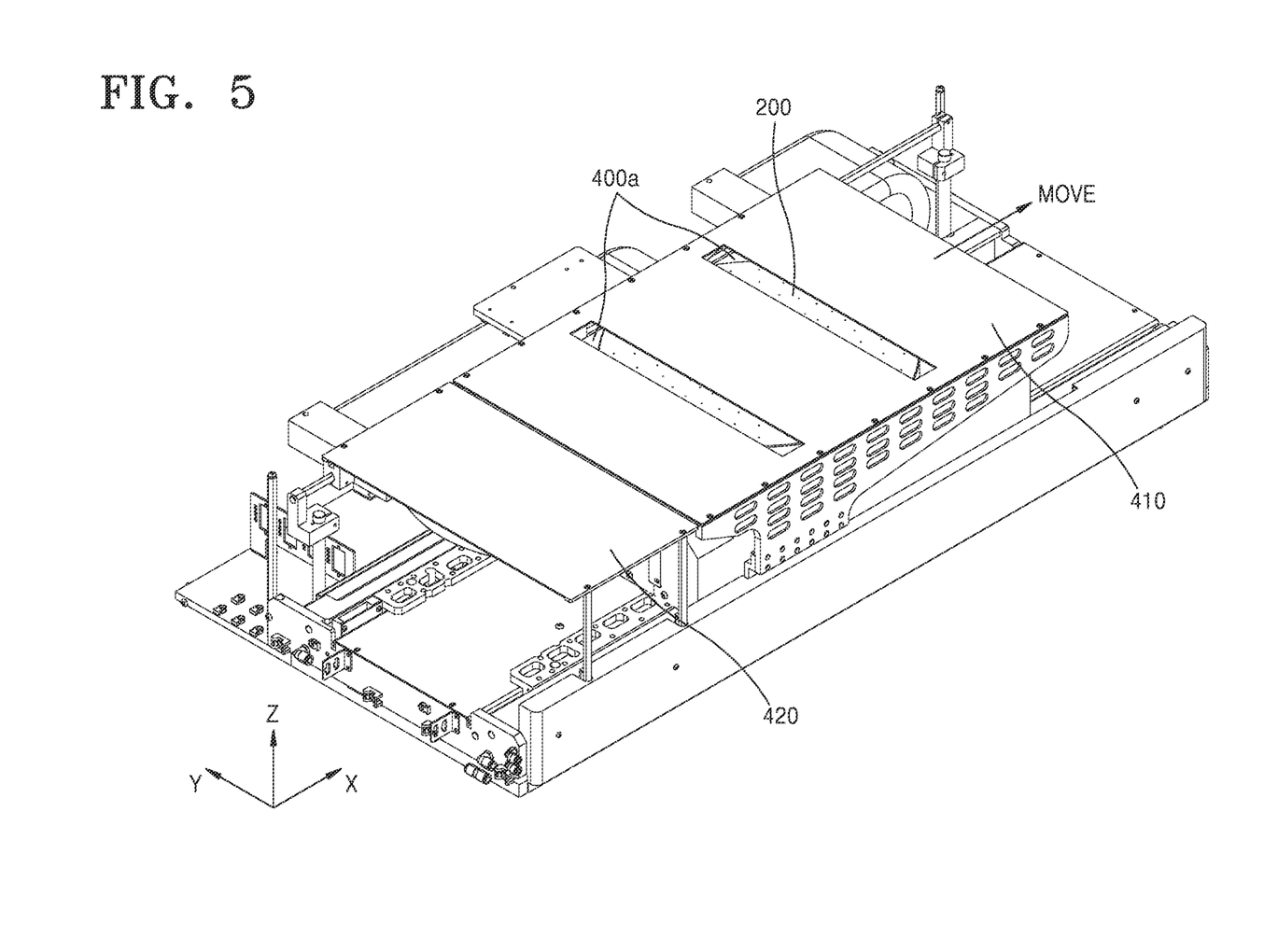
FIG. 5 is a view illustrating a fixed bonding stage cover and a movable bonding stage cover according to an embodiment.

FIG. 5 is a view illustrating a fixed bonding stage cover and a movable bonding stage cover according to an embodiment.

Referring to FIGS. 1 to 5, according to an embodiment, the bonding apparatus includes a bonding head 100, a wafer chuck 200 configured to place a wafer thereon, and at least one bonding stage cover 400 disposed above the wafer chuck 200.

The bonding head 100 may be driven along Y and Z axes and around a theta axis to mount semiconductor chips on a wafer substrate. The wafer chuck 200 may be driven along an X axis after holding a wafer carrier by vacuum suction. The bonding head 100 and the wafer chuck 200 may be driven respectively along the Y axis and the X axis toward a mounting point.

According to an embodiment, the bonding head 100 may be sealed with a plurality of separate covers. Inside the bonding head 100 sealed with the plurality of separate covers, bonding-head vacuum suction devices 110a and 120a may be arranged and may remove foreign substances from the inside of the bonding head 100.

The bonding head 100 may include a first bonding head 110 and a second bonding head 120. The first bonding head 110 and the second bonding head 120 may be driven separately. The first bonding head 110 and the second bonding head 120 may be symmetrically arranged.

According to an embodiment, the bonding apparatus may include a first bonding-head transferer 111 configured to transfer the first bonding head 110, and a second bonding-head transferer 121 configured to transfer the second bonding head 120. The first bonding-head transferer 111 may transfer the first bonding head 110 along the Y axis. The second bonding-head transferer 121 may transfer the second bonding head 120 along the Y axis.

Each of the first bonding-head transferer 111 and the second bonding-head transferer 121 may be sealed with a plurality of separate covers.

Bonding-head-transfer-unit vacuum suction devices 111a and 121a may be respectively arranged inside the first bonding-head transferer 111 and the second bonding-head transferer 121. The bonding-head-transfer-unit vacuum suction devices 111a and 121a may remove foreign substances respectively from the insides of the first and second bonding-head transferers 111 and 121.

According to an embodiment, the bonding apparatus may include a dual vision camera 300 configured to photograph the inside of the bonding apparatus. The dual vision camera 300 may take images of a process of mounting semiconductor chips on a wafer substrate, and thus any abnormality in the mounting process may be checked using the images taken by the dual vision camera 300.

The dual vision camera 300 may be sealed. The dual vision camera 300 may include a first dual vision camera 310 and a second dual vision camera 320. The first dual vision camera 310 and the second dual vision camera 320 may be driven and moved separately. The first dual vision camera 310 and the second dual vision camera 320 may be driven along the X axis or the Y axis.

The first dual vision camera 310 may include a first motion device 310a configured to move the first dual vision camera 310. The first motion device 310a may be sealed with a plurality of separate covers, and a vacuum suction device may be disposed in the first motion device 310a to remove foreign substances from the inside of the first motion device.

The second dual vision camera 320 may include a second motion device 320a configured to move the second dual vision camera 320. The second motion device 320a may be sealed with a plurality of separate covers, and a vacuum suction device may be disposed in the second motion device 320a to remove foreign substances from the inside of the second motion device.

According to an embodiment, at least one bonding stage cover 400 may prevent wafers from being contaminated. For example, a plurality of bonding stage covers 400 may be continuously arranged. The plurality of bonding stage covers 400 may include a fixed bonding stage cover 410 and a movable bonding stage cover 420.

Referring to FIG. 5, the fixed bonding stage cover 410 may be fixed, and the movable bonding stage cover 420, which is disposed in parallel with the fixed bonding stage cover 410, may be movable along the X axis. The movable bonding stage cover 420 may be moved along the X axis to secure a space when a wafer is supplied to the wafer chuck 200 or discharged from the wafer chuck 200.

Referring to FIG. 5, openings 400a may be provided in the at least one bonding stage cover 400. The openings 400a may have relatively small areas to prevent interference with a mountable position of the bonding head 100. The openings 400a may have a rectangular shape or another shape and may partially expose an upper side of the watcher chuck 200.

According to an embodiment, the bonding apparatus may include an air curtain 500 disposed above at least one bonding stage cover 400 to generate air flows. The air curtain 500 may include a first air curtain 510 and a second air curtain 520. The first and second air curtains 510 and 520 may be arranged side by side and adjacent to each other along the X axis and may generate air flows in opposite directions. Air flow directions are shown by arrows in FIGS. 2 and 4.

Because the first and second air curtains 510 and 520 form air flows toward both sides, foreign substances may not enter a space below at least one bond stage cover 400 through the openings 400a of at least one bond stage cover 400 which is disposed below the first and second air curtains 510 and 520.

As shown in FIG. 2, a fan filter unit (FFU) 700 may be disposed above the air curtain 500. The FFU 700 may introduce air in a direction toward the air curtain 500 as illustrated by an arrow. For example, clean air introduced through the FFU 700 may be forced to flow toward opposite sides by the air curtain 500 disposed at a center position inside the bonding apparatus, and because clean air is circulated inside the bonding apparatus, foreign substances may be removed from the inside of the bonding apparatus.

According to an embodiment, the bonding apparatus may further include an air curtain processor to control the air curtain 500. The air curtain 500 may be turned on and off under the control of the air curtain processor. For example, the air curtain processor may more flexibly control the operation timing of the air curtain 500 In addition, the air curtain processor may also more flexibly control the operation timing of the FFU 700.

According to an embodiment, the bonding apparatus may include a particle measurer 600. The particle measurer 600 may include a sensor, which is disposed at a center position inside the air curtain 500 and configured to sense foreign substances. Thus, the particle measurer 600 may perform real-time monitoring for detecting foreign substances inside the bonding apparatus.

Hereinafter, a method of controlling the bonding apparatus will be described according to an embodiment with reference to FIG. 6.

Figure 6:
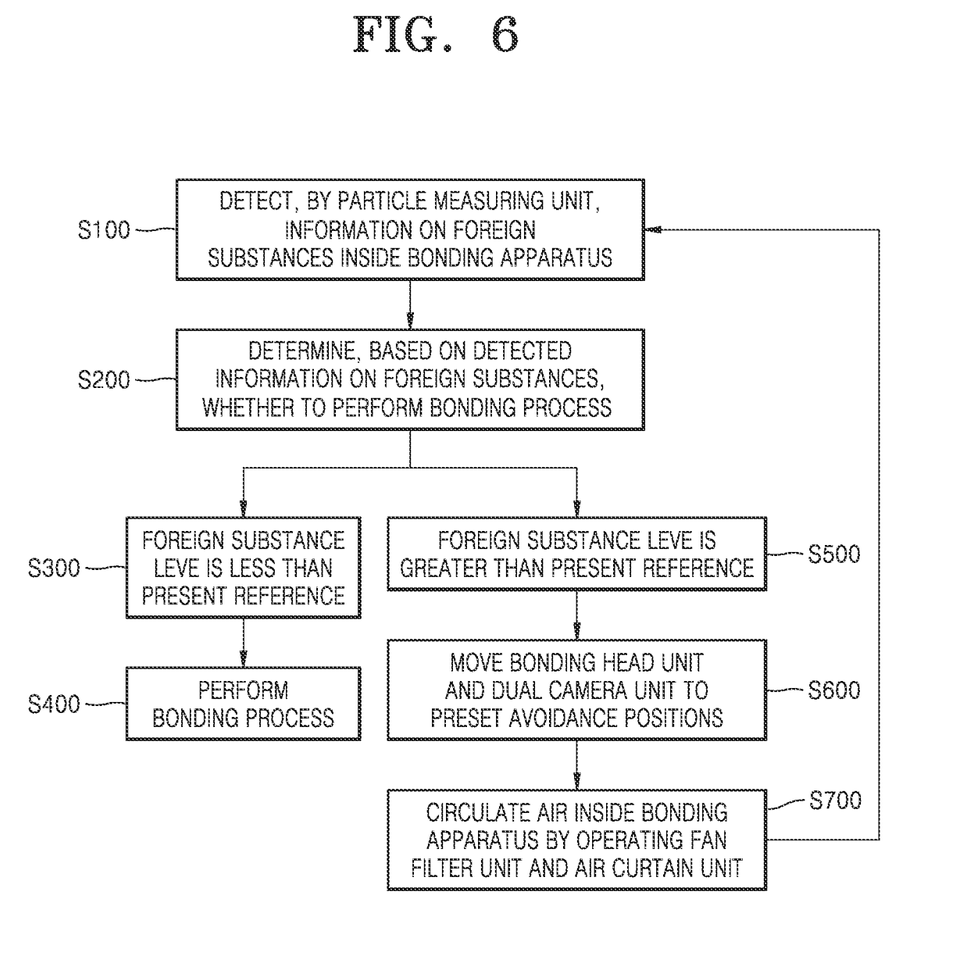
FIG. 6 is a view illustrating a method of controlling a bonding apparatus according to an embodiment.

FIG. 6 is a view illustrating a method of controlling the bonding apparatus according to an embodiment.

Referring to FIG. 6, the bonding apparatus controlling method of the embodiment includes detecting, by the particle measurer 600, information on foreign substances inside the bonding apparatus (S100), and determining, based on the information on foreign substances, whether to perform a bonding process (S200).

According to an embodiment, in the operation S200 of determining, based on the information on foreign substances, whether to perform the bonding process, when it is determined that a foreign substance level or amount is less than a preset reference level (S300), the bonding process may be performed (S400).

However, when it is determined that the foreign substance level or amount is greater than the preset reference level (S500), the bonding apparatus controlling method may further include moving the bonding head 100 and the dual vision camera 300 to preset avoidance positions (S600), and circulating air inside the bonding apparatus by operating the FFU 700 and the air curtain 500 (S700). In addition, after circulating air, the operation S100 of detecting, by the particle measurer 600, information on foreign substances inside the bonding apparatus may be repeated, and when the level or amount of foreign substances gradually reduces and is less than the preset reference level (S300), the bonding process may be performed again (S400).

As described above, the level or amount of foreign substances inside the bonding apparatus may be reduced using a foreign substance removing device (for example, the FFU 700) and the control method for removing foreign substances from the bonding apparatus, thereby improving the quality of products and securing smooth operations of the bonding apparatus.

A control unit may include a computing device such as a workstation computer, a desktop computer, a laptop computer, or a tablet computer. The control unit may include a simple controller, a microprocessor, a complex processor such as a central processing unit (CPU) or a graphics processing unit (GPU), a processor configured by software, or dedicated hardware or firmware. For example, the controller and the processor may be implemented by a general-use computer or an application-specific hardware component such as a digital signal processor (DSP), a field programmable gate array (FPGA), or an application-specific integrated circuit (ASIC).

Although various embodiments have been described with reference to the accompanying drawings, the embodiments are merely examples. Those of ordinary skill in the art to which the present disclosure pertains will understand that various modifications and other equivalent embodiments may be made in or from the embodiments. Therefore, the scope of the present disclosure should be defined by the appended claims and their equivalents.

Specific techniques described in embodiments are merely examples and do not limit the technical scope of the embodiments. In order to concisely and clearly describe embodiments of the present disclosure, descriptions of general techniques and configurations of the related art may be omitted. Furthermore, line connections or connection members between elements depicted in the drawings represent functional connections and/or physical or circuit connections by way of example, and in actual applications, they may be replaced or embodied with various additional functional connections, physical connections, or circuit connections. In addition, elements described without using terms such as "essential" and "important" may not be necessary for constituting embodiments of the present disclosure.

An element referred to with the definite article or a demonstrative determiner may be construed as the element or the elements even though it has a singular form. Unless otherwise defined, the ranges defined herein are intended to include any embodiment to which values within the ranges are individually applied and may be considered to be the same as individual values constituting the ranges in the detailed description of the embodiments. Operations of a method may be performed in an appropriate order unless explicitly described in terms of order or described to the contrary. Operations of a method are not limited to the stated order thereof. In addition, examples or exemplary terms (for example, "such as" and "etc.") are used for the purpose of description and are not intended to limit the scope of the present disclosure unless defined by the claims. Also, those skilled in the art will readily appreciate that many alternations, combinations, and modifications may be made according to design conditions and factors within the scope of the appended claims and their equivalents.

As described above, according to the one or more of the above embodiments, foreign substances may be effectively removed from the inside of the bonding apparatus.

Effects of the present disclosure are not limited to the effects mentioned above, and those skilled in the art will clearly understand other effects from the claims.

It should be understood that embodiments described herein should be considered in a descriptive sense only and not for purposes of limitation. Descriptions of features or aspects within each embodiment should typically be considered as available for other similar features or aspects in other embodiments. While example embodiments have been described with reference to the figures, it will be understood by those of ordinary skill in the art that various changes in form and details may be made therein without departing from the spirit and scope of the disclosure as defined by the following claims and their equivalents.

What is claimed is:

1. A bonding apparatus comprising:
   a bonding head;
   a wafer chuck configured to receive a wafer thereon; and
   at least one bonding stage cover on the wafer chuck,
   wherein the bonding head is sealed, and
   wherein a bonding-head vacuum suction device is inside the bonding head, and configured to remove foreign substances from an inner region of the bonding head.

2. The bonding apparatus of claim 1, wherein the at least one bonding stage cover comprises a plurality of bonding stage covers, and
   wherein the plurality of bonding stage covers comprise a fixed bonding stage cover and a movable bonding stage cover.

3. The bonding apparatus of claim 1, wherein an opening is formed in the at least one bonding stage cover, and
   wherein the opening does not overlap with a position to which the bonding head is movable.

4. The bonding apparatus of claim 1, further comprising an air curtain on the at least one bonding stage cover and configured to generate air flow.

5. The bonding apparatus of claim 4, wherein the air curtain comprises a first air curtain and a second air curtain, and
   wherein the first air curtain and the second air curtain are adjacent to each other along a first direction and configured to generate air flows in opposite directions.

6. The bonding apparatus of claim 4, wherein a fan filter unit (FFU) is on the air curtain, and the FFU introduces air toward the air curtain.

7. The bonding apparatus of claim 4, further comprising an air curtain processor configured to control the air curtain,
wherein the air curtain processor is configured to perform on/off control on the air curtain.

8. The bonding apparatus of claim 1, further comprising a particle measurer configured to detect foreign substances.

9. The bonding apparatus of claim 1, further comprising a bonding-head transferer configured to transfer the bonding head,
wherein the bonding-head transferer is sealed, and
wherein a bonding-head-transfer-unit vacuum suction device is inside the bonding-head transferer, and configured to remove foreign substances from an inner region of the bonding-head transferer.

10. The bonding apparatus of claim 1, further comprising a dual vision camera configured to take images of an inner region of the bonding apparatus,
wherein the dual vision camera is sealed, and
wherein a dual vision camera vacuum suction device is inside the dual vision camera and configured to remove foreign substances from an inner region of the dual vision camera.

11. A method of controlling a bonding apparatus, the method comprising:
detecting, by a particle measurer, information on foreign substances inside the bonding apparatus; and
determining, based on the information on the foreign substances, performance of a bonding process,
wherein the determining performance of the bonding process comprises:
when it is determined, based on the information on the foreign substances, that a foreign substance level is greater than a preset level, moving a bonding head and a dual vision camera to preset avoidance positions;
circulating air inside the bonding apparatus by operating a fan filter unit (FFU); and
based on the foreign substance level being lowered based on the circulating of air, performing the bonding process.

12. The method of claim 11, wherein the determining performance of the bonding process comprises:
when it is determined, based on the information on the foreign substances, that a foreign substrate level is less than the preset level, performing the bonding process.

13. A bonding apparatus comprising:
a bonding head;
a wafer chuck configured to receive a wafer thereon;
at least one bonding stage cover on the wafer chuck; and
an air curtain on the at least one bonding stage cover and configured to generate air flow,
wherein the at least one bonding stage cover comprises a plurality of bonding stage covers, and
wherein the plurality of bonding stage covers comprise a fixed bonding stage cover and a movable bonding stage cover.

14. The bonding apparatus of claim 13, wherein an opening is formed in the at least one bonding stage cover.

15. The bonding apparatus of claim 13, wherein the air curtain comprises a first air curtain and a second air curtain, and
wherein the first air curtain and the second air curtain are adjacent to each other along a first direction and configured to generate air flows in opposite directions.

16. The bonding apparatus of claim 13, wherein a fan filter unit (FFU) is on the air curtain, and the FFU introduces air toward the air curtain.

17. The bonding apparatus of claim 13, further comprising an air curtain processor configured to control the air curtain,
wherein the air curtain processor is configured to perform on/off control on the air curtain.

* * * * *